United States Patent [19]
Lee

[11] Patent Number: 6,063,708
[45] Date of Patent: May 16, 2000

[54] METHOD FOR FORMING ISOLATION LAYER IN SEMICONDUCTOR DEVICE

[75] Inventor: Joo Hyong Lee, Seoul, Rep. of Korea

[73] Assignee: LG Semicon Co., LTD., Chungcheongbuk-Do, Rep. of Korea

[21] Appl. No.: 09/178,894

[22] Filed: Oct. 27, 1998

[30] Foreign Application Priority Data

Jan. 10, 1998 [KR] Rep. of Korea ........................... 98/452

[51] Int. Cl.⁷ ..................................................... H01L 21/00
[52] U.S. Cl. ......................... 438/692; 438/713; 438/719; 438/723; 438/757
[58] Field of Search ..................................... 438/692, 713, 438/719, 723, 724, 743, 744, 757; 216/38, 67, 79

[56] References Cited

U.S. PATENT DOCUMENTS 5,866,466  2/1999  Kim et al. ............................ 438/692 X
5,923,993  7/1999  Sahota .................................. 438/692 X

OTHER PUBLICATIONS

Han Sin Lee et al., 1996 Symposium on VLSI Technology Digest of Technical Papers, "An Optimized Densification of the Filled Oxide for Quarter Micron Shallow Trench Isolation (STI)," pp. 158–159.

*Primary Examiner*—William Powell
*Attorney, Agent, or Firm*—Morgan, Lewis & Bockius LLP

[57] ABSTRACT

A method for forming an isolating layer in a semiconductor device including the steps of sequentially forming a buffer oxide layer, a CVD oxide layer and a first nitride layer on a semiconductor substrate, selectively removing the first nitride layer, selectively exposing a surface of the semiconductor substrate using the first nitride layer as a mask, forming and planarizing a second nitride layer on the selectively exposed surface of the semiconductor substrate, removing the CVD oxide layer and buffer oxide layer using the second nitride layer as a mask, while leaving a nitride pattern layer which becomes wider in an upward direction, forming oxide sidewalls at sides of the nitride pattern layer, forming a trench having a slope by selectively etching the semiconductor substrate using the oxide sidewalls as a mask, depositing a filling insulating material layer on the nitride pattern layer, the oxide sidewalls and in the trench, planarizing the filling insulating material layer until a surface of the nitride pattern layer is exposed, removing the nitride pattern layer by using the filling insulating material layer as a mask, and etching back the filling insulating material layer to form an isolating layer having a portion in the trench and another portion at sides of the trench.

16 Claims, 8 Drawing Sheets

METHOD FOR FORMING ISOLATION LAYER IN SEMICONDUCTOR DEVICE

This application claims the benefit of Korean patent application No. 452/1998, filed Jan. 10, 1998, which is hereby incorporated by reference.

BACKGROUND OF THE INVENTION

1. Field of the Invention

The present invention relates to a semiconductor device, and more particularly, to a method for forming an isolating layer in a semiconductor device where formation of a recess in the isolating layer at a boundary with an active region during an STI (Shallow Trench Isolation) step is prevented to improve isolation.

2. Discussion of the Related Art

In general, an isolation layer is formed by field oxidation using an oxidation-resistant insulating layer pattern as a mask, or by STI, in which a trench is formed in a semiconductor substrate, and the trench is filled with an insulating material.

A conventional method for forming an isolating layer by STI will be explained with reference to the attached drawings. FIGS. 1A–1C illustrate sections showing the process steps of the conventional method for forming an isolating layer, and FIGS. 2A–2C illustrate sections and a micrograph showing a problem in the conventional method.

Referring to FIG. 1A, the conventional method for forming an isolating layer by STI begins with subjecting a semiconductor substrate 1 to thermal oxidation to form a thermal oxidation film 2 on a surface of the semiconductor substrate 1, and forming a nitride layer 3 on the thermal oxidation film 2. The nitride layer 3 is selectively etched by photolithography to remove the nitride layer 3 in isolating regions only. Exposed semiconductor substrate 1 is selectively etched using the patterned nitride layer 3 as a mask, forming trenches 4. As shown in FIG. 1B, an insulating material is deposited on an entire surface to fill the trenches 4 formed in isolating regions in the semiconductor substrate 1 and subjected to CMP (Chemical Mechanical Polishing), forming isolating layers 5. As shown in FIG. 1C, the nitride layer 3 and the thermal oxidation layer 2, which are used as masks in the trench formation, are then removed. Thus, in the conventional method for forming an isolating layer by using STI (which is widely used for improving isolation of devices), the isolating layer is formed by forming certain depths of trenches 4 in a semiconductor substrate and filling the trenches 4 with the insulating material.

However, the conventional method for forming an isolating layer by using STI has a problem in that a recess is formed in the insulating material layer filling the trenches 4 at a boundary with an active layer when the nitride pattern layer 3 is removed by wet etching after filling the trenches 4 with the insulating material. The recess, which becomes greater in an isotropic form in a cleaning process, causes formation of a thick portion in deposition of a material layer for a gate, such as doped polysilicon layer. The polysilicon layer with such a thicker portion should be overetched to form the gate, which causes a problem of device performance degradation resulting from damage to the substrate due to the overetch, which is difficult to prevent. In order to prevent the damage to the substrate, if the following steps are conducted without the overetch, namely, the steps shown in FIGS. 2A and 2B, a polysilicon layer 6 is deposited and etched to form a gate electrode layer. Portions of the polysilicon layer 6 remain as shown in FIG. 2B, and remain even after completion of the fabrication process as shown in FIG. 2C, causing shorts between gate lines, and resulting in a malfunction of the device.

SUMMARY OF THE INVENTION

Accordingly, the present invention is directed to a method for forming an isolation layer in a semiconductor device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a first aspect of the present invention there is provided a method for forming an isolating layer in a semiconductor device including the steps of sequentially forming a buffer oxide layer, a CVD oxide layer and a first nitride layer on a semiconductor substrate, selectively removing the first nitride layer, selectively exposing a surface of the semiconductor substrate using the first nitride layer as a mask, forming and planarizing a second nitride layer on the selectively exposed surface of the semiconductor substrate, removing the CVD oxide layer and buffer oxide layer using the second nitride layer as a mask, while leaving a nitride pattern layer which becomes wider in an upward direction, forming oxide sidewalls at sides of the nitride pattern layer, forming a trench having a slope by selectively etching the semiconductor substrate using the oxide sidewalls as a mask, depositing a filling insulating material layer on the nitride pattern layer, the oxide sidewalls and in the trench, planarizing the filling insulating material layer until a surface of the nitride pattern layer is exposed, removing the nitride pattern layer by using the filling insulating material layer as a mask, and etching back the filling insulating material layer to form an isolating layer having a portion in the trench and another portion at sides of the trench.

In another aspect of the present invention there is provided a method for forming an isolating layer in a semiconductor device including the steps of forming a buffer oxide film on a semiconductor substrate, and forming a polysilicon layer thereon and selectively removing the polysilicon layer, forming oxide sidewalls at sides of the patterned polysilicon layer, forming a nitride layer between the oxide sidewalls, and removing exposed polysilicon layer by wet etching using the oxide sidewalls and the nitride layer as a mask, forming a trench by selectively etching the semiconductor substrate using the nitride layer and the oxide sidewalls as a mask, depositing a filling insulating material layer in the trench and at sides of the trench, and planarizing, the filling insulating material layer to expose the nitride layer, wet etching the nitride layer using the planarized filling insulating material layer as a mask, and etching back the filling insulating material layer to form an isolating layer having a portion in the trench and another portion at sides of the trench.

In another aspect of the present invention there is provided a method for forming an isolating layer in a semiconductor device including the steps of forming a buffer oxide layer on a semiconductor substrate, forming a CVD oxide layer on the buffer oxide layer, forming a first nitride layer on the CVD oxide layer, selectively removing the first nitride layer, exposing portions of the semiconductor substrate using the first nitride layer as a mask, forming a second nitride on the semiconductor substrate, planarizing the second nitride layer on the exposed portions of the semiconductor substrate, removing the CVD oxide layer and buffer oxide layer using the second nitride layer as a mask, while leaving a nitride pattern layer that is wider in an upward direction, forming oxide sidewalls at sides of the nitride pattern layer, selectively etching the semiconductor substrate using the oxide sidewalls as a mask to form a sloped trench, depositing a filling insulating material layer on the nitride pattern layer, the oxide sidewalls and in the trench, planarizing the filling insulating material layer to expose the nitride pattern layer, removing the nitride pattern layer by using the filling insulating material layer as a mask, and etching back the filling insulating material layer to form an isolating layer having a portion in the trench and another portion at sides of the trench.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF THE PREFERRED EMBODIMENTS

Reference will now be made in detail to the preferred embodiments of the present invention, examples of which are illustrated in the accompanying drawings.

Figure 1A:
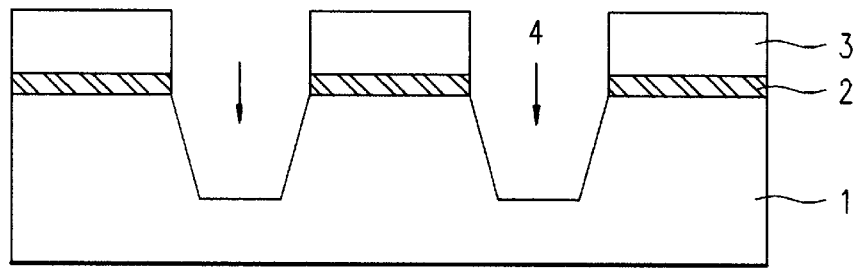
FIGS. 1A–1C illustrate sections showing the process steps of a conventional method for forming an isolating layer.
Figure 1B:
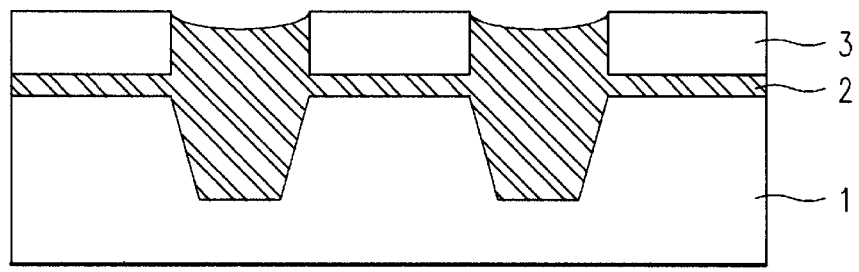
Figure 1C:
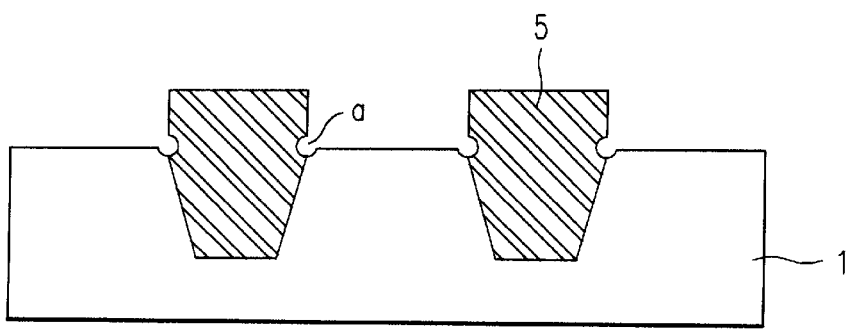
Figure 2A:
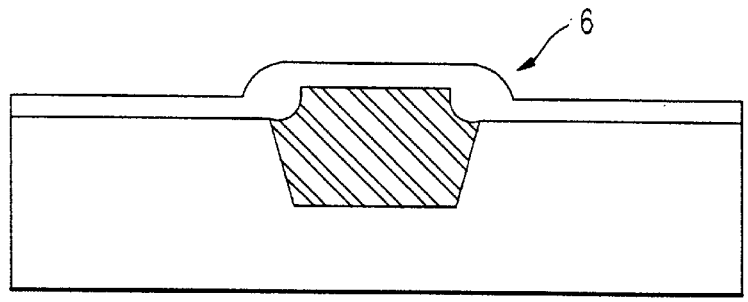
FIGS. 2A–2C illustrate sections and a micrograph showing a problem in the conventional method.
Figure 2B:
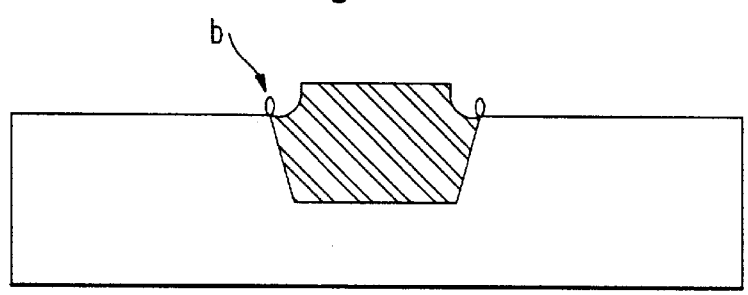
Figure 2C:
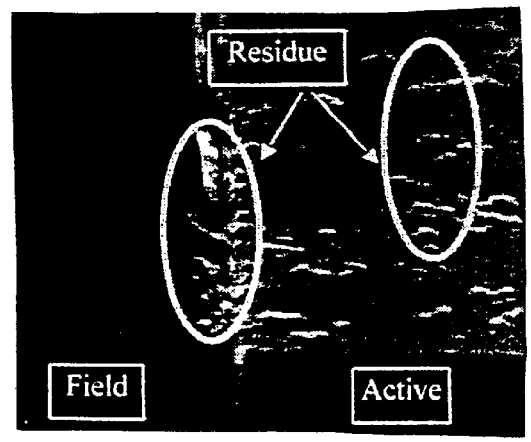
Figure 3A:
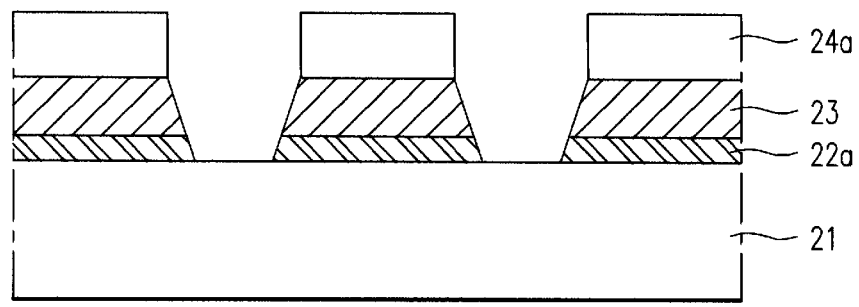
FIGS. 3A–3H illustrate sections showing the process steps of a method for forming an isolating layer in accordance with a first preferred embodiment of the present invention.
Figure 3B:
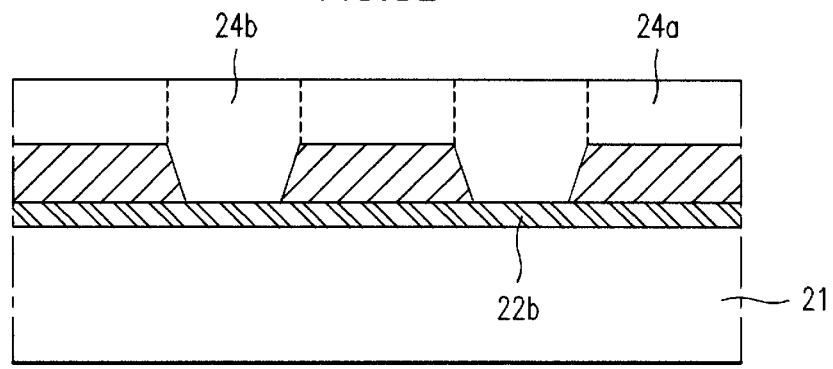
Figure 3C:
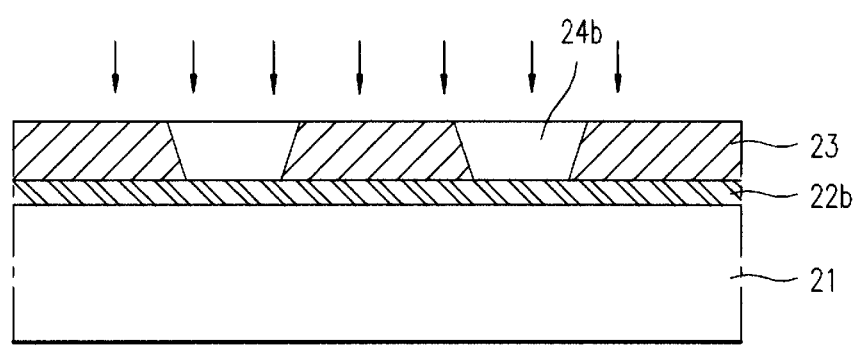
Figure 3D:
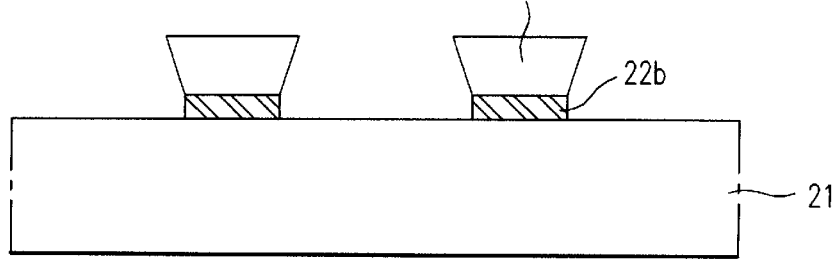
Figure 3E:
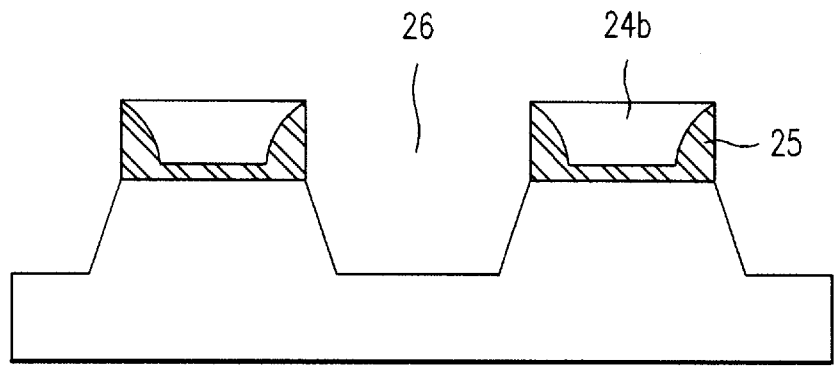
Figure 3F:
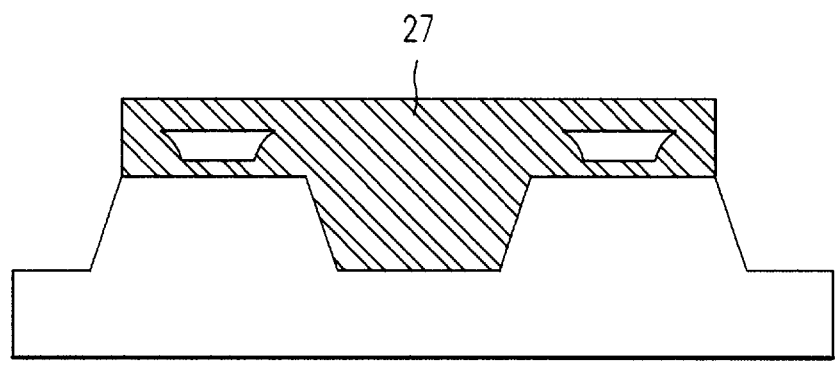
Figure 3G:
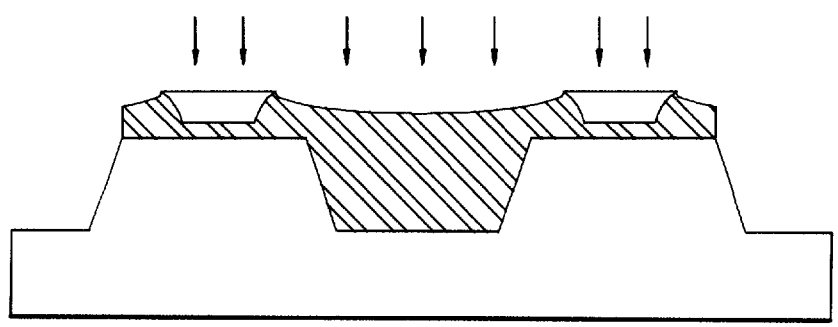
Figure 3H:
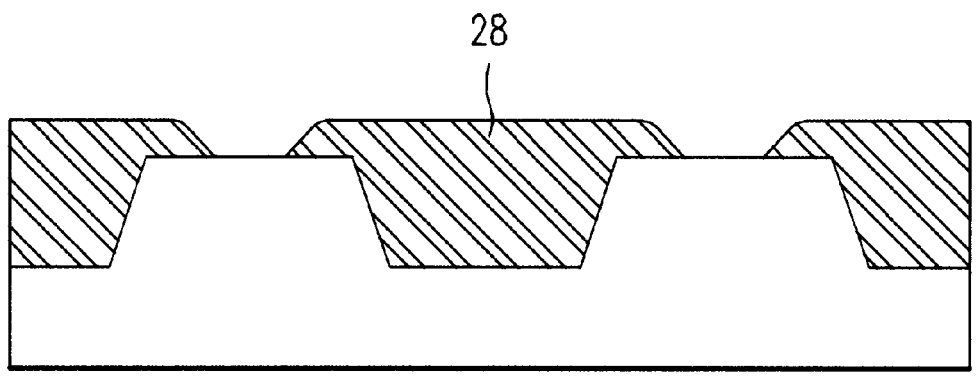

Referring to FIG. 3A, the method for forming an isolating layer in accordance with a first preferred embodiment of the present invention starts with subjecting a semiconductor substrate 21 to thermal oxidation to form a buffer oxide film 22a, and forming a CVD oxide film layer 23 on the buffer oxide film 22a. A nitride layer 24a is formed on the CVD oxide film layer 23 and subjected to selective etching by photolithography, patterning the nitride layer 24a to leave the nitride layer 24a only in isolating regions. The CVD oxide film layer 23 and the buffer oxide film 22a are subjected to selective dry etching using the patterned nitride layer 24a as a mask, removing the CVD oxide film layer 23 and the buffer oxide film 22a over an active region. A bias in the selective dry etching of the CVD oxide film layer 23 and the buffer oxide film 22a is adjusted to create a slope in etched portions of the CVD oxide film layer 23. That is, a bottom width of the CVD oxide film layer 23 is narrower than a top width of the CVD oxide film layer 23, which is exposed when the patterned nitride layer 24a is patterned. Then, as shown in FIG. 3B, a buffer oxide film 22b is formed on the semiconductor substrate 21, which is again exposed by the removal of the CVD oxide film layer 23 and the buffer oxide film 22a. A nitride layer 24b is formed on an entire surface of the device, including the buffer oxide layer 22b and the patterned nitride layer 24a. As shown in FIG. 3C, the nitride layer 24b is subjected to CMP (Chemical Mechanical Polishing), to planarize the nitride layer 24b to an initial height of the CVD oxide film 23 (the initial nitride layer 24a has been completely removed). As shown in FIGS. 3D–3E, the exposed CVD oxide film 23 and the buffer oxide film 22a are wet etched using the planarized nitride layer 24b as a mask, selectively removing the CVD oxide film layer 23 and the buffer oxide film 22a. Then, as shown in FIG. 3F, an oxide sidewall material is deposited on an entire surface and etched back, to form oxide sidewalls at sides of the nitride layer 24b, which becomes the wider with height. The exposed semiconductor substrate 21 is selectively etched using the nitride layer 24b with the oxide sidewalls 25 as masks, to form a trench 26, and a filling insulating material layer 27 is deposited on an entire surface of the device and in the trench 26. As shown in FIG. 3G, the filling insulating material layer 27 is subjected to CMP, planarizing the filling insulating material layer 27 until an upper surface of the nitride layer 24b is exposed. Then, as shown in FIG. 3H, the nitride layer 24b is removed. The filling insulating material layer 27 is etched back to form an isolating layer 28 having a portion in the trench 26 and a portion on the substrate 21 and at sides of the trench 26.

A method for forming an isolating layer in accordance with a second preferred embodiment of the present invention will now be explained.

Figure 4A:
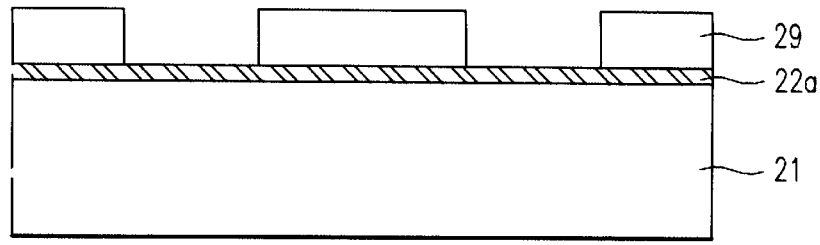
FIGS. 4A–4H illustrate sections showing the process steps of a method for forming an isolating layer in accordance with a second preferred embodiment of the present invention.
Figure 4B:
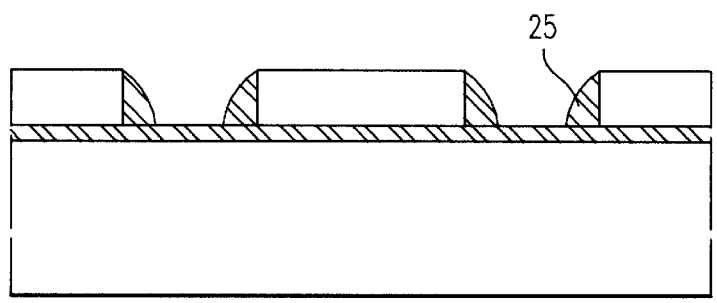
Figure 4C:
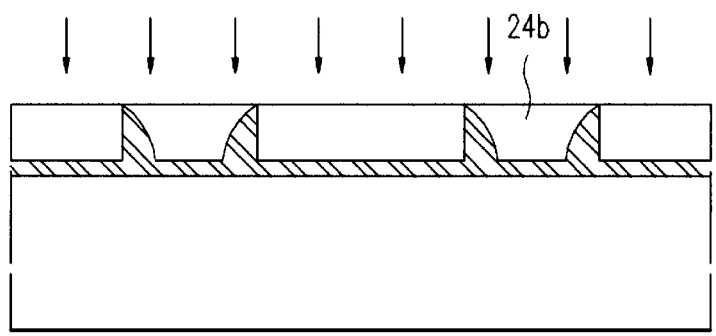
Figure 4D:
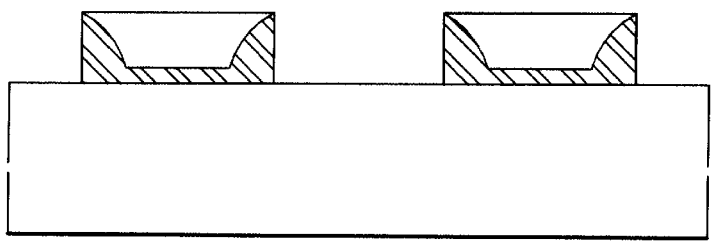
Figure 4E:
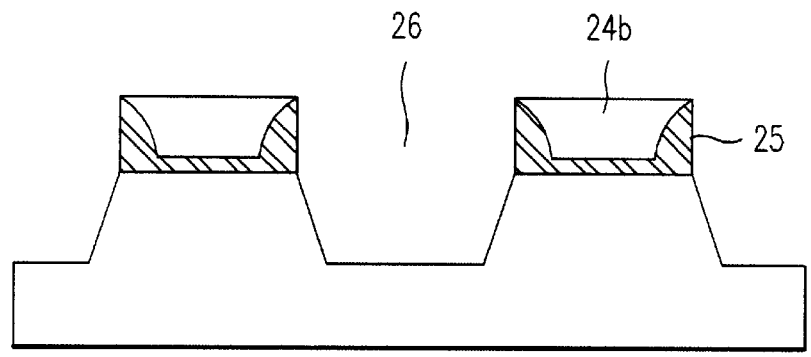
Figure 4F:
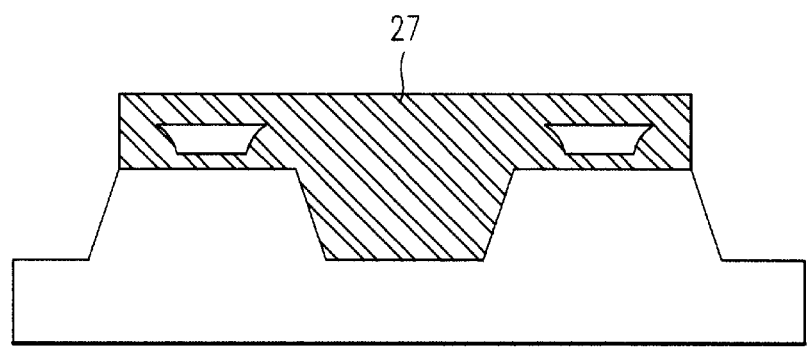
Figure 4G:
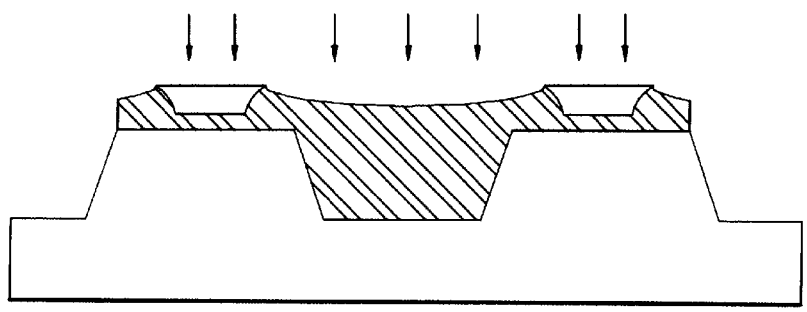
Figure 4H:
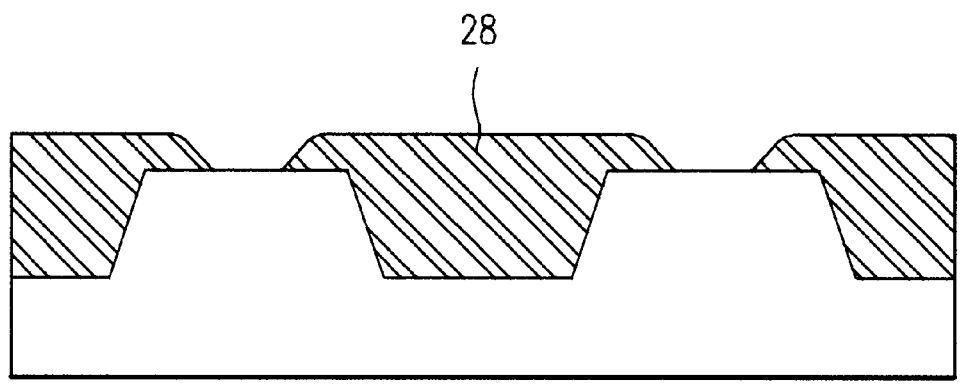

Referring to FIG. 4A, a semiconductor substrate 21 is subjected to thermal oxidation to form a buffer oxide film 22a, and a polysilicon layer 29 is formed on the buffer oxide film 22a. The polysilicon layer 29 is subjected to patterning by photolithography, selectively removing portions of the polysilicon layer 29, and leaving the polysilicon layer 29 only in isolating regions. As shown in FIG. 4B, an oxide film is deposited on an entire surface of the device and on the patterned polysilicon layer 29 and etched back, leaving the oxide film only at sides of the patterned polysilicon layer 29, and forming oxide sidewalls 25. Then, as shown in FIG. 4C, a nitride layer 24b is filled in spaces between the oxide sidewalls 25. In the filling of the spaces with the nitride layer 24b, the nitride layer 24b is first formed on an entire surface of the device and on the patterned polysilicon layer 29 and the oxide sidewalls 25, and then subjected to CMP planarizing the nitride layer 24a at an initial height of the polysilicon layer 29. As shown in FIG. 4D, the exposed polysilicon layer 29 is wet etched using the planarized nitride layer 24b as a mask, removing the exposed polysilicon layer 29. The exposed buffer oxide film 22a is also removed, leaving the nitride layer 24b which becomes wider with height. Then, as shown in FIG. 4E, the exposed semiconductor substrate 21 is selectively etched using the nitride layer 24b and the oxide sidewalls 25 as mask, to form a trench 26. The trench 26 is formed with a slope such that the trench 26 has a width that is narrower towards the bottom. As shown in FIG. 4F, a filling insulating material 27 is deposited on an entire surface of the device and in the trench 26, to cover the nitride layer 24b completely. As shown in FIG. 4H, the nitride layer 24b is removed. Then, the filling insulating material 27 is etched back, to form an isolating layer 28 having a portion in the trench 26 and a portion on the semiconductor substrate 21 at sides of the trench 26. Thus, the method for forming an isolating layer in a semiconductor device of the present invention can prevent the unintended formation of a recess in an oxide film at a boundary of an active region and a field region after a nitride pattern layer is wet etched using a negative nitride slope mask and oxide sidewalls.

Since the method for forming an isolating layer of the present invention can prevent the formation of a recess in the isolating layer at a boundary of an active region and peripheral circuit regions, the method for forming an isolating layer of the present invention can improve device isolation.

The uniform deposition of the doped polysilicon layer in the formation of a gate electrode permitted by the prevention of formation of recesses in the isolating layer eliminates the requirement for an overetch, and prevents damage to the active region.

It will be apparent to those skilled in the art that various modifications and variations can be made in the method for forming an isolating layer in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming an isolating layer in a semiconductor device comprising the steps of:
   sequentially forming a buffer oxide layer, a CVD oxide layer and a first nitride layer on a semiconductor substrate;
   selectively removing the first nitride layer;
   selectively exposing a surface of the semiconductor substrate using the first nitride layer as a mask;
   forming and planarizing a second nitride layer on the selectively exposed surface of the semiconductor substrate;
   removing the CVD oxide layer and buffer oxide layer using the second nitride layer as a mask, while leaving a nitride pattern layer which becomes wider in an upward direction;
   forming oxide sidewalls at sides of the nitride pattern layer;
   forming a trench having a slope by selectively etching the semiconductor substrate using the oxide sidewalls as a mask;
   depositing a filling insulating material layer on the nitride pattern layer, the oxide sidewalls and in the trench;
   planarizing the filling insulating material layer until a surface of the nitride pattern layer is exposed;
   removing the nitride pattern layer by using the filling insulating material layer as a mask; and
   etching back the filling insulating material layer to form an isolating layer having a portion in the trench and another portion at sides of the trench.

2. The method as claimed in claim 1, wherein a bias in an etching of the CVD oxide film layer is adjusted to make a width of the CVD oxide layer narrower with depth during the step of removing the CVD oxide layer.

3. The method as claimed in claim 1, wherein the step of forming a buffer oxide layer includes forming the buffer oxide on an exposed surface of the semiconductor substrate.

4. The method as claimed in claim 1, wherein the step of forming and planarizing a second nitride layer includes the step of planarizing the second nitride layer by CMP to have a same height as an initially formed height of the CVD oxide layer.

5. The method as claimed in claim 1, wherein the step of planarizing the filling insulating material layer includes planarizing the filling insulating material layer by CMP, and wherein the nitride pattern layer is removed by wet etching using the filling insulating material as a mask.

6. A method for forming an isolating layer in a semiconductor device comprising the steps of:
   forming a buffer oxide film on a semiconductor substrate, and forming a polysilicon layer thereon and selectively removing the polysilicon layer;
   forming oxide sidewalls at sides of the patterned polysilicon layer;
   forming a nitride layer between the oxide sidewalls, and removing exposed polysilicon layer by wet etching using the oxide sidewalls and the nitride layer as a mask;
   forming a trench by selectively etching the semiconductor substrate using the nitride layer and the oxide sidewalls as a mask;
   depositing a filling insulating material layer in the trench and at sides of the trench, and planarizing the filling insulating material layer to expose the nitride layer;
   wet etching the nitride layer using the planarized filling insulating material layer as a mask; and
   etching back the filling insulating material layer to form an isolating layer having a portion in the trench and another portion at sides of the trench.

7. The method as claimed in claim 6, further including the step of planarizing the nitride layer by CMP to a same height as an initially formed height of the polysilicon layer.

8. The method as claimed in claim 6, wherein step of etching back the filling insulating material layer includes etching the filling insulating material layer by using the nitride layer and the sidewalls as a mask so as to form the trench with a slope such that a width of the trench becomes narrower towards a bottom surface.

9. The method as claimed in claim 6, wherein the step of depositing a filling insulating material layer includes depositing the filling insulating material layer to cover the nitride layer.

10. The method as claimed in claim 6, wherein step of planarizing the filling insulating material layer includes using CMP to expose a surface of the nitride layer.

11. The method as claimed in claim 6, wherein, in the patterning process of the polysilicon layer, the polysilicon layer is selectively etched to remain only in an isolating region.

12. A method for forming an isolating layer in a semiconductor device comprising the steps of:
   forming a buffer oxide layer on a semiconductor substrate;
   forming a CVD oxide layer on the buffer oxide layer;
   forming a first nitride layer on the CVD oxide layer;
   selectively removing the first nitride layer;
   exposing portions of the semiconductor substrate using the first nitride layer as a mask;
   forming a second nitride on the semiconductor substrate;
   planarizing the second nitride layer on the exposed portions of the semiconductor substrate;
   removing the CVD oxide layer and buffer oxide layer using the second nitride layer as a mask, while leaving a nitride pattern layer that is wider in an upward direction;

forming oxide sidewalls at sides of the nitride pattern layer;

selectively etching the semiconductor substrate using the oxide sidewalls as a mask to form a sloped trench;

depositing a filling insulating material layer on the nitride pattern layer, the oxide sidewalls and in the trench;

planarizing the filling insulating material layer to expose the nitride pattern layer;

removing the nitride pattern layer by using the filling insulating material layer as a mask; and etching back the filling insulating material layer to form an isolating layer having a portion in the trench and another portion at sides of the trench.

13. The method as claimed in claim 12, wherein a bias in an etching of the CVD oxide film layer is adjusted to make a width of the CVD oxide layer narrower with depth during the step of removing the CVD oxide layer.

14. The method as claimed in claim 12, wherein the step of forming a buffer oxide layer includes forming the buffer oxide on an exposed surface of the semiconductor substrate.

15. The method as claimed in claim 12, wherein the step of forming and planarizing a second nitride layer includes the step of planarizing the second nitride layer by CMP to have a same height as an initially formed height of the CVD oxide layer.

16. The method as claimed in claim 12, wherein the step of planarizing the filling insulating material layer includes planarizing the filling insulating material layer by CMP, and wherein the nitride pattern layer is removed by wet etching using the filling insulating material as a mask.

* * * * *